Figure 1A:
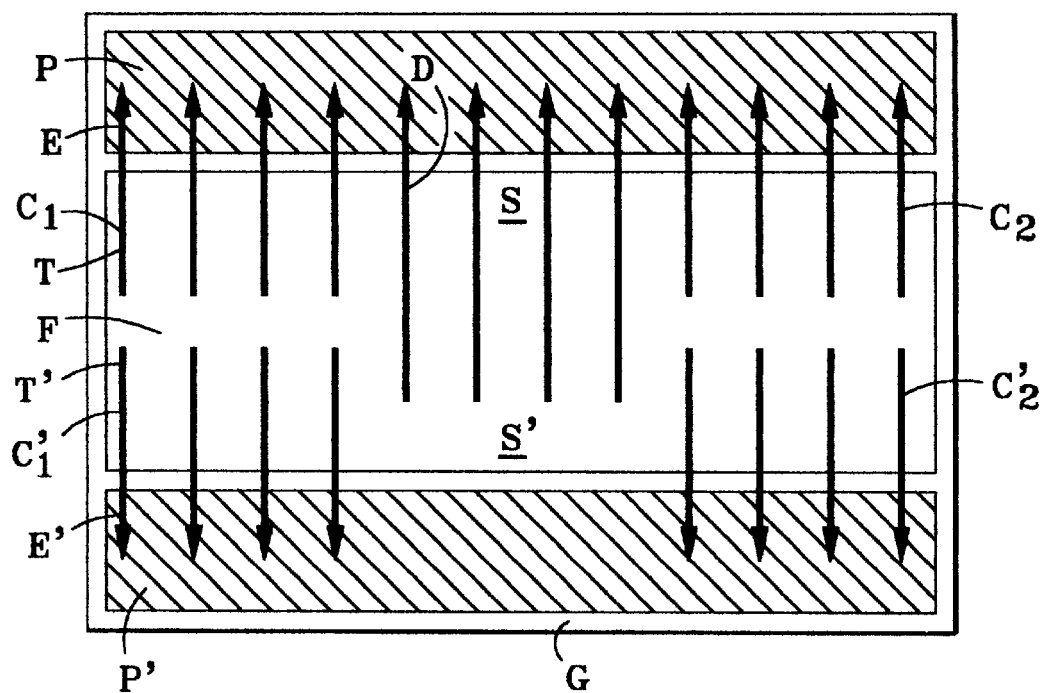

United States Patent [19]
Marconi et al.

[11] Patent Number: 5,991,163
[45] Date of Patent: Nov. 23, 1999

[54] ELECTRONIC CIRCUIT BOARD ASSEMBLY AND METHOD OF CLOSELY STACKING BOARDS AND COOLING THE SAME

[75] Inventors: Peter Marconi, Franklin; Theodore W. Bilodeau, Concord; Michael John Rigby, Littleton, all of Mass.

[73] Assignee: Nexabit Networks, Inc., Marlborough, Mass.

[21] Appl. No.: 09/190,521

[22] Filed: Nov. 12, 1998

[51] Int. Cl.$^6$ .............................. H05K 7/10; H05K 7/14; H05K 7/20; H05K 9/00

[52] U.S. Cl. ..................... 361/788; 361/684; 361/686; 361/687; 361/692; 361/724; 361/796; 361/800; 361/816; 361/831; 710/102; 211/41.17

[58] Field of Search .................... 361/684, 686, 361/687, 692, 693, 695, 788, 796, 797, 800, 802, 816, 818, 831, 724, 727; 312/223.2; 439/61, 64, 377; 710/102; 211/26, 26.2, 41.17

[56] References Cited

U.S. PATENT DOCUMENTS

| | | | |
|---|---|---|---|
| 4,022,326 | 5/1977 | Marconi ................................. | 439/377 |
| 4,454,566 | 6/1984 | Coyne ..................................... | 361/796 |
| 4,511,950 | 4/1985 | Bunner et al. .......................... | 361/788 |
| 4,777,615 | 10/1988 | Potash .................................... | 439/377 |
| 4,860,163 | 8/1989 | Sarath .................................... | 361/796 |
| 4,872,212 | 10/1989 | Roos et al. ............................. | 361/788 |
| 5,289,340 | 2/1994 | Yoshifugi ................................ | 439/61 |
| 5,467,254 | 11/1995 | Brusati et al. .......................... | 361/816 |
| 5,533,631 | 7/1996 | Marchetti .............................. | 211/41.17 |
| 5,603,044 | 2/1997 | Annapareddy et al. ................ | 361/788 |
| 5,708,552 | 1/1998 | Han et al. ............................... | 361/727 |
| 5,782,546 | 7/1998 | Iwatare .................................. | 361/818 |
| 5,887,158 | 3/1999 | Sample et al. .......................... | 439/61 |

*Primary Examiner*—Leo P. Picard
*Assistant Examiner*—John B. Vigushin
*Attorney, Agent, or Firm*—Rines and Rines

[57] ABSTRACT

An electronic circuit board assembly and method that enable close stacking and cooling of closely positioned pluralities of similar electronic I/O or memory boards and requiring high speed communication between the boards, such as high speed switching amongst the I/O terminals of the boards or CPU processing, and having an upper and a lower set of similar spaced groups of closely spaced vertical boards; powering terminals aligned along the upper edges of the upper set of boards, and along the lower edges of the lower set of boards, and terminals for connection with a switching fabric disposed along the lower edges of the upper set of boards and the upper edges of the lower set of boards; power backing planes mounted to power and support the lateral edges of the respective sets of groups of boards and extending across the upper and lower sections of the frame; and a plurality of parallel closely spaced vertical switching fabric boards comprising switching fabric (or CPU processing boards) and centrally mounted in the central space of the frame between the groups of boards of the upper and lower sets of boards, and with a backing plane therefor extending intermediately of the frame between the upper and lower section backing plates and isolatively separate therefrom to provide a no-power quiescent zone for the switching fabric (or CPU) boards.

24 Claims, 4 Drawing Sheets

ELECTRONIC CIRCUIT BOARD ASSEMBLY AND METHOD OF CLOSELY STACKING BOARDS AND COOLING THE SAME

The present invention relates to electronic circuit board mounting assemblies and techniques for closely stacking pluralities of such boards in relatively confined frames and housings; being more particularly directed to methods of packaging a significant number of high power, high frequency, very sensitive, large circuit boards into a confined width chassis and effectively cooling, managing electromagnetic radiation, and providing quiescent signal planes for high speed communication paths.

BACKGROUND

The electronic circuit board assembly mounting art is replete with varied mechanical layouts and techniques for permitting the insertion or plug-in and removal of pluralities of stacks of electronic boards or cards within confined frames, cages and housings.

With the use of large pluralities or banks of boards such as memory, CPU or I/O boards in computer systems, or line interface boards, switch fabrics, and control processors in networking equipment, problems attendant upon the cooling of proximally mounted boards requiring large amounts of power have arisen, along with the requirement for benign signaling environments for very high speed, low voltage signals. These very high-speed circuits, moreover, can generate strong electromagnetic radiation fields that must also be contained with the enclosure system. As more boards are required, they must be mounted closer and closer together, greatly increasing the airflow impedance and decreasing the allowable maximum component height on each board. This creates difficult cooling problems such as hot spots and dead zones on the boards, and this is additionally complicated by the increased power requirement for today's high-speed integrated circuits. These high-power, high-speed circuits require large amounts of airflow volume and very small enclosure openings to contain electromagnetic radiation; and these two requirements, unfortunately, are diametrically opposed.

Most current computers and networking equipment are constrained to be packaged in fixed width cabinets, such as 19-inch EIA racks. Designers have thus been forced to find ways of packaging more and more boards into such a fixed width chassis. One obvious method is to decrease the space between boards hence increasing the number of vertical boards in a chassis. Beyond sixteen boards, however, this become extremely difficult as the pitch of the boards falls below 1-inch, leaving little height on boards for taller components (and heat sinks) and dramatically increasing the airflow impedance, thereby requiring very powerful blower systems.

Another approach currently being used is to mount some boards vertically and others horizontally, either above or below the vertical boards. While many networking vendors are employing this approach, it has serious drawbacks. Such an approach, indeed, requires cooling air to be forced in two directions, vertically and horizontally within the chassis or housing, with the horizontal air intake and exhaust developing convection effects, and deleteriously exhausting air from the sides into adjacent equipments as in central offices and the like; and with side-exhausted air becoming pulled in by the blowers or fans providing the vertical cooling air for the vertical boards. When air is forced to turn corners or bend, however, energy is wasted and thermal performance is sacrificed. Further drawbacks of this approach revolve around the distance between the horizontal boards and the vertical boards. To provide an adequate air intake plenum, this space should be as large as possible. The larger the space between the boards, however, the greater the distance of the electrical path. Since many vendors are installing their switch fabric boards horizontally, this increases the distance between the I/O boards and the switch fabric.

Through the novel mounting approach of the present invention, on the other hand, all boards may be vertically mounted and with high densities in standard width enclosures; all airflow is strictly vertical, a low impedance airflow path is maintained; and a power distribution scheme is used to separate high current noisy supply voltages from low voltage sensitive interface logic, and with tight electromagnetic radiation containment.

OBJECTS OF INVENTION

A primary object of the invention, accordingly, is to provide a new and improved method of assembling and a novel mounting assembly for, closely positioned pluralities of similar electronic circuit boards containing high speed, sensitive interconnect circuits and also requiring large power supply currents, and that are not subject to the above-described and other disadvantages of prior art constructions, but that, to the contrary, enable high packing densities with all vertical board mounting and air cooling, and with isolated quiescent zones for the high speed interconnect circuits.

A further object is to provide in such a novel assembly, a low impedance airflow design along with a superior electromagnetic radiation suppression technique.

Other and further objects will be explained hereinafter and are more clearly set forth in the appended claims.

SUMMARY

In summary, from one of its viewpoints, the invention embraces a method of assembling closely positioned pluralities of similar electronic circuit boards (I/O or memory, for example) provided with powering terminals and requiring high speed communication (such as switching or other logic interfacing as later more fully described) between said circuit boards and adapted for substantially uniform cooling of the closely positioned boards. The method comprises, parallely stacking an upper set of similar spaced groups of closely spaced boards in an upper section of a frame with an intermediate space provided between the groups, and with the powering terminals aligned near the upper edges of the boards, and terminals provided for high speed interfacing near the lower edges of the boards; parallely stacking a lower set of similar spaced groups of closely spaced boards in a lower section of the frame with a similar intermediate space provided between the groups, and with the powering terminals of the boards aligned near the lower edges of the boards, and terminals provided for high speed logic interfacing, aligned near the upper edges of the boards facing the high speed interfacing terminals of the lower edges of the boards of the upper groups of boards; mounting a power backplane to support the set of groups of upper section boards and extending across the upper section of the frame, and mounting a similar power backplane to support the set of groups of the lower section boards and extending across the lower section of the frame; and positioning a plurality of parallel closely spaced high speed logic boards (such as a switching fabric, CPU, etc.) substantially centrally of the frame and disposed in the spaces between the groups of boards of the upper and lower section sets of boards, and with a backplane therefor extending intermediately of the frame between the upper and lower section backplanes and isolatively separate therefrom to provide a no-power quiescent zone for the high speed logic board signals; and substantially symmetrically connecting the lower edge logic interfacing terminals of the upper section boards and the upper edge logic interfacing terminals of the lower section boards to the high speed logic boards.

The resulting preferred assembly thus comprises a card cage system containing circuit boards that is divided into four equal-size outer quadrants surrounding a center column. Boards installed in the center column are substantially larger. All boards installed in the upper two outer quadrants and the upper half of the central column are installed upwards, and all similar boards installed in the lower two outer quadrants and the lower half of the central column are installed upside down, rotated 180°. All boards have their power terminals located in the same position (their outer edges), with the power terminals at the top for the upper boards and at the bottom for the lower boards. All boards have their high speed interfaces at the inner edges of the board such that all high speed interfaces with the logic boards are placed in the center of the card cage where the high speed logic boards (switch fabric or CPU) are located such that all high speed inter-board communication occurs in a very small area.

Backplanes that span the upper and lower halves of the card cage are comprised of three separate printed circuit boards (PCBs) stacked one on top of the other and mounted to a frame which makes them appear to be boards as one uniform backplane. The top and bottom backplanes are identical with the bottom rotated 180° from the top. The top and bottom backplanes distribute power only and contain no logic signals. The center backplane, which carries all logic signals, contains no power distribution voltages, only logic signals. Each one of these two different PCBs can be optimized for the function it must perform.

Preferred and best mode assembly structures and designs are later more fully described.

DRAWINGS

Figure 1B:
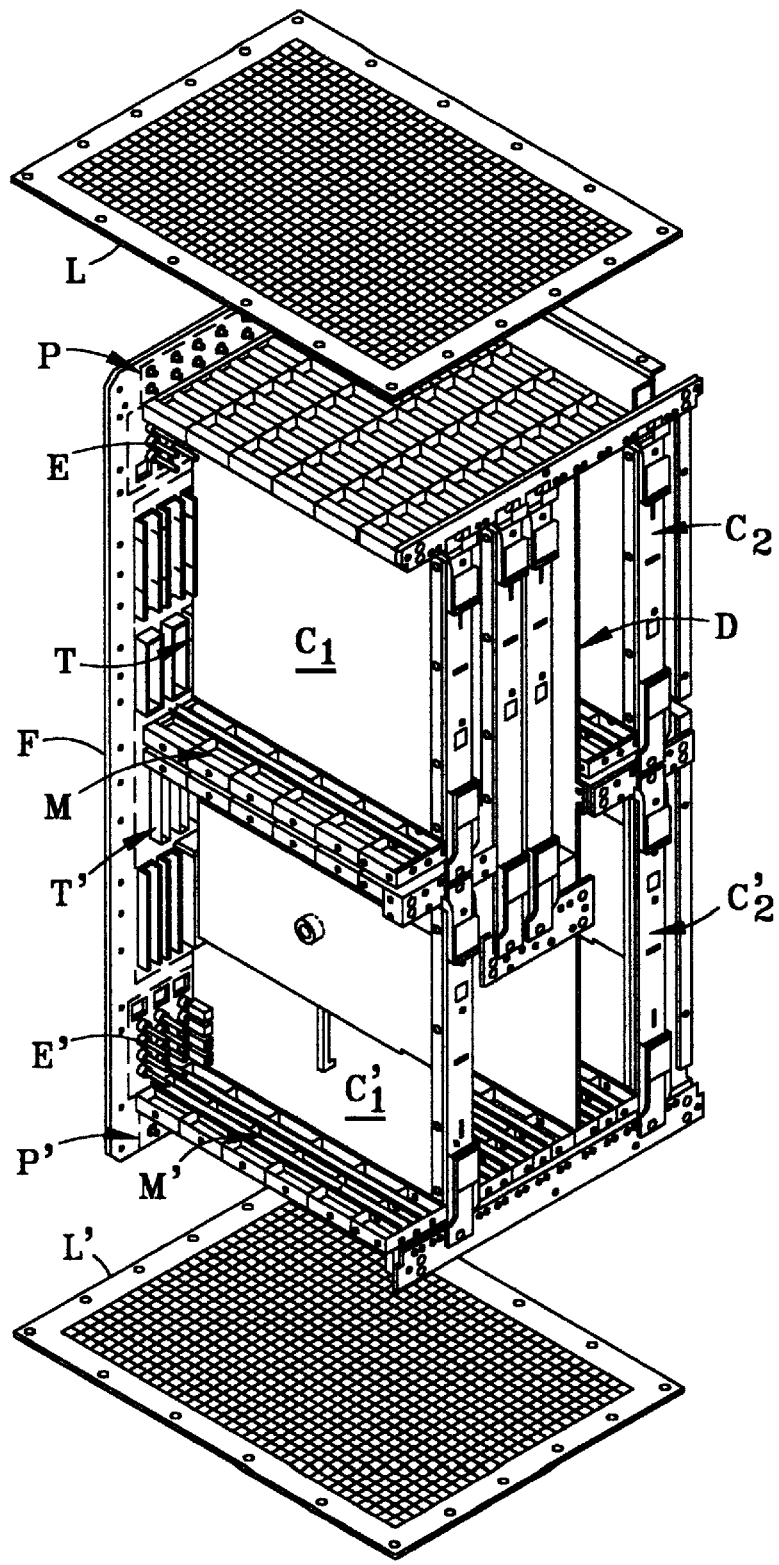
Figure 1C:
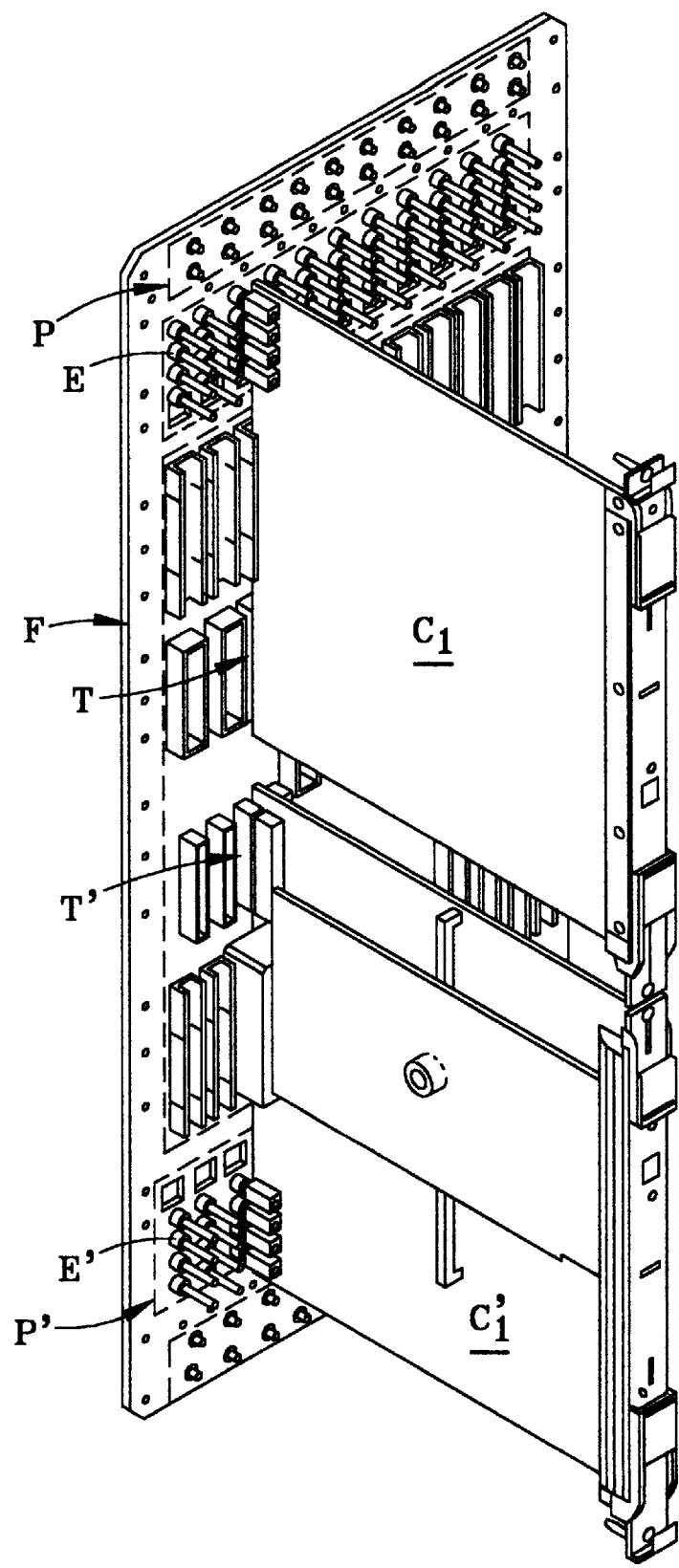
Figure 1D:
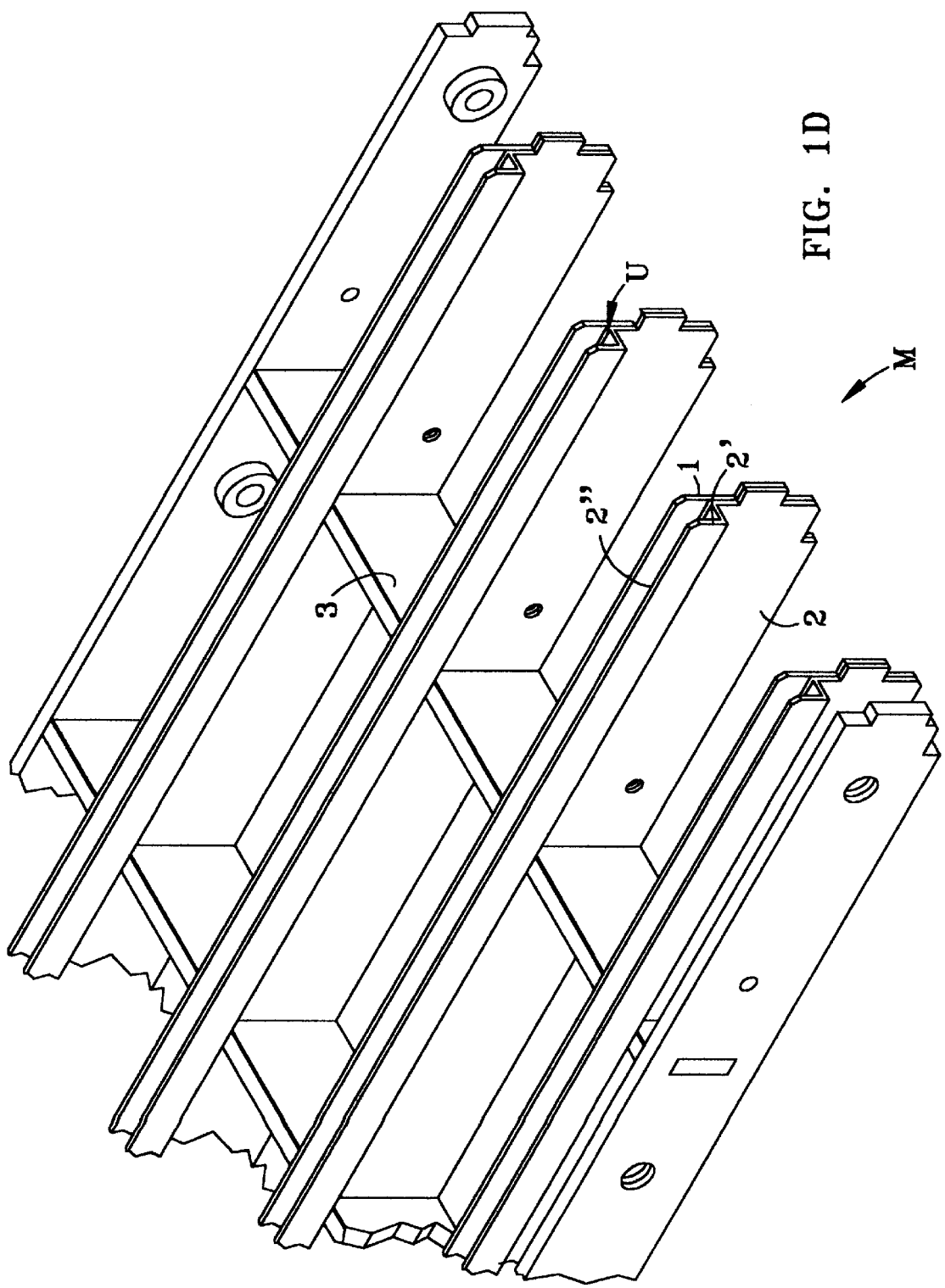

The invention will now be described with reference to the accompanying drawings, FIG. 1A of which is a diagrammatic view of the board placement in accordance with the principles of the invention;

FIGS. 1B and 1C are isometric views of a mounting assembly embodying the technique of the invention in the preferred form of the format of FIG. 1A; and FIG. 2 is an isometric view upon an enlarged scale of a preferred mounting channel structure particularly useful in the assembly of FIGS. 1B and C.

PREFERRED EMBODIMENT(S) OF INVENTION

Referring first to the diagrammatic view of FIG. 1A, an electronic circuit board assembly is shown, as in the before-mentioned standard 19-inch or other card cage frame or housing G, holding closely positioned pluralities, for example, of similar electronic I/O (or memory) boards $C_1$, $C_2$, etc. containing high speed signal circuits and provided with powering terminals; and, in the illustrative and preferred application of the present invention, requiring high speed switching amongst the I/O terminals of the boards as, for example, for the type of internally cached multiple DRAM switching systems described in Mukesh Chatter U.S. Pat. No. 5,799,209, issued Aug. 25, 1998, and the corresponding foreign counterpart of which appears in PCT publication-WO97/24725.

Front-to-rear mounting slots or channels M, shown in FIGS. 1B and 1C as extending transversely within the frame, receive the boards in vertical parallel stacks—an upper set of similar spaced groups $C_1$ and $C_2$ of closely spaced boards in an upper section of the frame (mounted in the left quadrant and in the right quadrant, respectively), and with an intermediate central column space S provided between the groups $C_1$ and $C_2$. Powering terminals E are shown aligned near the upper edges of the boards $C_1$ and $C_2$, and lower edge terminals T are provided for high-speed switching interfacing connection over the later-described main backplane F, with central logic boards here shown as a switching fabric comprising vertical logic boards D, disposed in the central space S between the boards $C_1$ and $C_2$.

In the lower preferably symmetrical section of the frame, similar mounting slots or channels M', FIG. 1B, hold a lower set of similar vertical spaced quadrant groups $C_1'$ and $C_2'$ of closely spaced boards, with a similar intermediate central space S' provided between the groups $C_1'$ and $C_2'$. The powering terminals E' for these groups of boards, however, are aligned near the lower edges of the lower set of boards $C_1'$ and $C_2'$ and terminals T' for interfacing connection with the switching fabric are provided near the upper edges of the boards, 180° oppositely to the mounting of the upper sets of boards $C_1$ and $C_2$, and facing the switching terminals T of the lower edges of the boards of the upper groups of boards. This assembly permits all of the high-speed switching signals to the upper and lower groups of I/O memory boards to end up next to each other and right at the switch fabric boards D (or, in other applications, CPU or other logic) in the area between interfacing connector terminals T and T'.

An upper power backing plane P is horizontally mounted to provide board plug-in power connection and to support the lateral edges of the set of groups $C_1$, and $C_2$ of the upper section boards and extends across the upper section of the frame, FIGS. 1B and 1C. This is the zone where the relatively heavy currents are being circulated (for example, driven by -48 volts at the power terminals E). A similar power backing plane P' is symmetrically mounted to support and power the set of groups $C_1'$ and $C_2'$ of the lower section boards and also extends horizontally across the lower section of the frame. These high power backplanes P and P', may be constructed, for example, of copper-clad fiberglass (FR4) and support the high power high current requirements of the operation of the I/O board system. The main backplane F between the upper and lower backplanes P and P', however, is where all the high speed interconnect circuits are routed through interfacing terminals T and T'. Not only is there high-speed communication between I/O boards in the quadrants and the switch fabric modules in the center, but also between the I/O boards themselves.

At the opposite end of the spectrum is the requirement for very high speed logic interconnect channels comprised of very sensitive signals that can be adversely affected by noise generated by the switching of large currents. The main backplane F disposed between the power backplane s P and P', contains no such power supply currents and is accordingly herein referred to as a "no-power quiescent zone". The parallel closely spaced logic switching boards D comprising the switching fabric, thus, are centrally mounted in the frame and extend in the space S, between the groups of boards of the upper and lower section sets of boards, and with the backplane F extending horizontally intermediately of the frame between the upper and lower section backplanes P and P' and isolatively separate therefrom to provide such no-power quiescent zone for high speed interconnect signals, such as those of the switching fabric boards (or, in other applications, CPU or the like). The switch fabric boards D are shown occupying the upper space S, and terminating at their terminal connections at the main backplane F for connection with the interfacing terminals T, T' of the sets of boards $C_1$, $C_1'$, $C_2$, $C_2'$. Substantially symmetrical plug-in connections are provided from the lower edge switching terminals T of the upper section boards $C_1$ and $C_2$ and from the upper edge switching terminals fabric board T' of the lower section boards $C_1$ and $C_2$ to the switching fabric boards D along the backplane F.

In practice, for the internally cached DRAM network application above described, where 12–16 I/O boards may be stacked in the board groups, the three backplanes P, P' and F are preferably mounted into a metal frame G, as with precision-drilled location holes which then locate all of these backplanes very precisely and make them appear to simulate one continuous physical single backplane to all the board cards that are plugging in.

The switching fabric boards D connected with the backplane F are shown positioned for their interfacing terminals to be in line respectively with, though between, the interfacing terminals T, T' of the upper and lower section boards, remote from the regions of the board power terminals E and E' at backplanes P and P'. The power terminals E, E' used on the power backplanes P and P' are sturdy rugged conventional heavy-duty, heavy current power connectors; whereas the terminals T and T' used to plug into the F backplane, are very delicate high-density connectors.

The novel construction of the invention permits the cooling in the system to be provided, all from the bottom to the top of the frame, and all unidirectionally vertically. Since no horizontal boards are used, no convection problems are present, and there are no issues with thermal heat rising off of one board and heating the successive boards above it. With the cooling air going straight up through the frame so that all air horsepower is utilized in cooling the boards, an optimized relatively small blower system may be used, even in a 19-inch rack.

Further to maintain efficient air cooling of the tightly packed board assembly, and serendipitously to provide trapping of electromagnetic radiation generated by the high speed switching within the frame from escaping therefrom, an open egg-crate type of metal grill lid, is provided over the top exhaust of the frame or housing at L and also at the air inlet at L'. This not only allows for optimum unimpeded or low-impedance uniform flow of air in-line from the bottom through the top along the surfaces of the board cards, but the square or rectangular or other cell openings of the metal grill L, L' may be dimensioned relative to the wavelength of the principal electromagnetic radiation frequencies generated by the high speed switching, to serve as electromagnetic wave-guide cut-off attenuators, trapping or attenuating the radiation within the frame. For example, with high-speed switching by the boards D in the range of 12 GHz in frequency (ies), a cross-dimension of square grill wave-guide-like cells, ½ inch on the side and ½ inch deep, will provide about 23 to 24 dB at the 12 GHz cut off frequency, and on the order of about 27 dB at frequencies well below 12 GHz.

Again, with consideration of air cooling of tightly packed boards and also of simplicity and low cost of card mounting slot or channel construction, the mounting slots or channels M, M' may preferably be formed of inexpensive substantially U-shaped structures as shown in FIG. 2. A metal sheet is there shown folded, with the upper portion 1 of one side (right) serving as one wall of the U-shaped channel, juxtaposed against the lower portion 2 of the other side (left) of the folded sheet. The other side 2 is then bent transversely at 2' to form the bottom of the U channel, along which the board cards are inserted and board cards are inserted and withdrawn, and then the sheet is bent upwardly at 2", parallel to the upper portion 1, to serve as the opposite wall of the U-shaped channel. Transverse supports 3 are shown provided between adjacent channels.

While most useful in the illustrative example of the high speed switching fabric herein described, it is to be understood, as before stated, that the techniques of the invention are not at all limited to this type of networking system or equipment. The architecture of the invention, indeed, is well suited for computer systems with processor cards (CPUs, before mentioned) located in the regions illustratively described herein for the switch fabric, and with memory or I/O cards disposed in the four quadrants. The centrally located logic boards may thus be more generically described as switch fabric/CPU cards.

Further modifications will also occur to those skilled in this art, and such are considered to fall within the spirit and scope of the invention as defined in the appended claims.

What is claimed is:

1. A method of assembling closely positioned pluralities of similar electronic circuit boards provided with powering terminals and requiring high speed communication between said circuit boards and adapted for substantially uniform cooling of the closely positioned boards, that comprises, parallely stacking an upper set of similar spaced groups of closely spaced boards in an upper section of a frame with an intermediate space provided between the groups, and with the powering terminals aligned near the upper edges of the boards, and terminals provided for high speed interfacing at the lower edges of the boards; parallely stacking a lower set of similar spaced groups of closely spaced boards in a lower section of the frame with a similar intermediate space provided between the groups, and with the powering terminals of the boards aligned near the lower edges of the boards, and terminals provided for high speed interfacing aligned at the upper edges of the boards facing the high speed interfacing terminals of the lower edges of the boards of the upper groups of boards; mounting a power backplane to support the set of groups of upper section boards and extending across the upper section of the frame, and mounting a similar power backplane to support the set of groups of the lower section boards and extending across the lower section of the frame; and positioning a plurality of parallel closely spaced high speed logic boards substantially centrally of the frame and disposed in the spaces between the groups of boards of the upper and lower section sets of boards, and with a backplane therefor extending intermediately of the frame between the upper and lower section backplanes and isolatively separate therefrom to provide a no-power quiescent zone for the high speed logic board signals; and substantially symmetrically connecting the lower edge interfacing terminals of the upper section boards and the upper edge interfacing terminals of the lower section boards to the high speed logic boards at their backplane.

2. The method of claim 1 wherein the circuit boards comprise one of I/O and memory boards, and the high speed logic boards comprise one of switching fabrics and CPUs.

3. The method of claim 1 wherein cooling air flow is passed in-line through the lower, the central and upper sections of the frame.

4. The method of claim 1 wherein all the boards are substantially vertically oriented and the backplanes are extended horizontally of the frame.

5. The method of claim 1 wherein the upper and lower sets of groups of boards each comprise a left-hand quadrant group and a right-hand quadrant group respectively aligned vertically, and the high speed logic group is mounted in a central space between the upper and lower frame sections between the left and right-hand quadrant groups of upper and lower board sets.

6. The method of claim 5 wherein the lower edges of the switching fabric boards are positioned to be somewhat in line respectively with, though between, the interfacing lower and upper terminal edges, respectively, of the upper and lower section boards.

7. An electronic circuit board assembly of closely positioned pluralities of similar electronic boards provided with powering terminals and requiring high speed communication between said circuit boards, having, in combination, mounting slots within a frame for parallely stacking an upper set of similar spaced groups of closely spaced boards in an upper section of the frame and with an intermediate space provided between the groups; powering terminals aligned near the upper edges of the boards, and terminals for high speed interfacing disposed near the lower edges of the boards; mounting slots for parallely stacking a lower set of similar spaced groups of closely spaced boards in a lower section of the frame with a similar intermediate space provided between the groups; powering terminals aligned near the lower edges of the lower set of boards, and terminals for high speed interfacing near the upper edges of the boards, facing the high speed interfacing terminals of the lower edges of the boards of the upper groups of boards; a power backplane mounted to power and support the set of groups of the upper section boards and extending across the upper section of the frame, and a similar power backplane mounted to power and support the set of groups of the lower section boards and extending across the lower section of the frame; and a plurality of parallel closely spaced high speed logic boards centrally mounted in the frame and extending in the spaces between the groups of boards of the upper and lower section sets of boards, and with a backplane extending intermediately of the frame between the upper and lower section backplanes and isolatively separate therefrom to provide a no-power quiescent zone for the high speed logic board signals; and substantially symmetrical connections from the lower edge interfacing terminals of the upper section boards and from the upper edge interfacing terminals of the lower section boards to the high speed logic boards at their backplane.

8. The electronic circuit board assembly as claimed in claim 7 wherein the circuit boards comprise one of I/O and memory boards, and the high-speed logic boards comprise one of switching fabrics and CPUs.

9. An electronic circuit board assembly as claimed in claim 7 wherein the mounting slots maintain all the boards substantially vertically oriented, and the backplanes extend horizontally of the frame.

10. The electronic circuit board assembly as claimed in claim 9 wherein means is provided for passing cooling air flow in-line through the lower, the intermediate and upper sections of the frame.

11. The electronic circuit board assembly as claimed in claim 7 wherein the upper and lower sets of groups of boards each comprise a left-hand quadrant group and a right-hand quadrant group respectively aligned vertically, and the high speed logic group is mounted in a central space between the upper and lower frame sections between the left and right-hand quadrant groups of the upper and lower board sets.

12. An electronic circuit board assembly as claimed in claim 11 wherein the lower edges of the high speed logic boards are positioned to be somewhat in line respectively with, though between, the interfacing lower and upper terminal edges, respectively, of the upper and lower section sets of boards.

13. A method of assembling closely positioned pluralities of similar electronic circuit I/O boards provided with powering terminals and requiring high speed switching amongst the I/O terminals of the boards and adapted for substantially uniform cooling of the closely positioned boards, that comprises, parallely stacking upper and lower quadrant sets of similar spaced groups of closely spaced boards in a frame with an intermediate central space provided between the groups, and with the powering terminals aligned near the upper edges of the upper set of boards and near the lower edges of the lower set of boards, and with terminals provided for interfacing connection with a high speed switching fabric near the lower edges of the upper set of boards and near the upper edges of the lower set of boards, facing one another; mounting upper and lower power backplanes to power and support the respective sets of groups of boards and extending across the upper and lower quadrant sections of the frame, respectively; and providing a plurality of parallel closely spaced switching logic boards comprising said switching fabric substantially centrally of the frame in said central space between the groups of boards of the upper and lower section sets of boards, and with a backplane provided therefor and extending intermediately of the frame between the upper and lower section backplanes and isolatively separate therefrom to provide a no-power quiescent zone for the switching fabric boards; and substantially symmetrically connecting the lower edge interfacing terminals of the upper section set of boards and the upper edge interfacing terminals of the lower section set of boards to the switching fabric boards at the switching fabric backplane.

14. An electronic circuit board assembly of closely positioned pluralities of similar electronic I/O boards provided with powering terminals and requiring high speed switching amongst the I/O terminals of the boards, having, in combination, mounting slots within a frame for parallely stacking an upper and a lower quadrant set of similar spaced groups of closely spaced boards in an upper and a lower section of the frame, respectively, and with an intermediate space provided between the groups of each of the upper and lower quadrant sets of groups; powering terminals aligned near the upper edges of the upper set of boards and near the lower edges of the lower set of boards, and terminals for interfacing with a switching fabric disposed along the lower edges of the upper set of boards and the upper edges of the lower set of boards; power backplanes mounted to power and support the respective sets of groups of boards and extending across the upper and lower sections of the frame; and a plurality of parallel closely spaced switching logic boards comprising said switching fabric and centrally mounted in said central space of the frame between the groups of boards of the upper and lower sets of boards, and with a backplane therefor extending intermediately of the frame between the upper and lower section backplanes and isolatively separate therefrom to provide a no-power quiescent zone for the switching fabric boards; and substantially symmetrical connections from the lower edge interfacing terminals of the upper section boards and from the upper edge interfacing terminals of the lower set of boards to the switching fabric boards at their backplane.

15. The electronic circuit board assembly as claimed in claim 14 wherein means is provided for passing cooling air from an intake at the bottom of the frame upward through the frame along the boards mounted therein to an exhaust at the top of the frame, and a metallic egg-crate grill is mounted over each of the air intake and exhaust of the frame and the openings of which are dimensioned relative to the wavelength of the high frequency radiation generated by the high speed switching to serve as cut-off electromagnetic waveguide traps for the high frequency radiation.

16. The electronic circuit board assembly of claim 15 wherein the openings of the grill are substantially square or rectangular and of the order of ½-inch on a side and in depth, providing substantial trapping of high frequency radiation of the order of 12 GHz and below.

17. The electronic circuit board assembly as claimed in claim 14 wherein the mounting slots comprise U-shaped single-piece channels for receiving and mounting the upper and lower edges of the boards transversely of the frame towards the backplanes.

18. The electronic circuit board assembly as claimed in claim 17 wherein the U-shaped single piece channels are formed of a folded sheet of metal the upper portion of one side of which serves as one wall of the U-shaped channel, with the lower portion of said one side juxtaposed against the lower portion of the other side of the folded sheet and then bent transversely to form the bottom of the U and then upwardly parallel to the one side upper portion to serve as the opposite wall of the U-shaped channel.

19. The electronic circuit board assembly as claimed in claim 14 wherein the power backplanes and intermediate switching fabric backplane are mounted in a further frame to simulate the physical appearance of a single continuous backplane.

20. An assembly of closely positioned similar circuit boards such as I/O and memory boards containing high speed interconnect circuits and provided with powering terminals and requiring high speed communication between said circuit boards and centrally located high speed logic circuit boards, such as switch fabrics and CPUs, having, in combination with a circuit board card cage system divided into four equal-size outer quadrants surrounding a central column, similar pluralities of equal-size boards mounted within the four quadrants, with all the boards installed vertically within the upper two outer quadrants and the upper half of the central column installed upwards, and all the boards installed vertically in the lower two outer quadrants and the lower half of the central column installed upside down; and power terminals provided along the tops of the upper boards and the bottom of the lower boards, and high speed logic-interfacing terminals provided along the bottom of the upper boards and the top of the lower boards, connecting to the high speed logic circuit boards, in turn mounted vertically at the center of the card cage so as to limit all high speed inter-board communication to within a central area.

21. The assembly of claim 20 wherein upper and lower backplanes are provided for mounting and distributing power to the upper and lower quadrant boards and containing no logic signals; and an intermediate backplane is provided for the central high speed logic circuit boards carrying all logic signals and containing no power distribution voltages.

22. The assembly of claim 21 wherein the backplanes span the back of the card cage and are mounted to a frame that causes them to appear as one uniform backplane.

23. For use in an electronic circuit board assembly mounted within a frame and wherein high frequency radiation is generated as from high speed switching or CPU circuits disposed on the circuit boards, means for passing cooling air from an intake at the bottom of the frame upward through the frame along the circuit boards mounted therein and out an exhaust on the top of the frame, and a metallic egg-crate grill mounted over each of the air intake and exhaust of the frame and the openings of which are dimensioned relative to the wavelength of the high frequency radiation generated by the high speed switching to serve as cut-off electromagnetic waveguide traps for the high frequency radiation.

24. For use in an electronic circuit board assembly, U-shaped single-piece channels for receiving circuit boards, formed of a folded sheet of metal the upper portion of one side of which serves as one wall of the U shaped channel, with the lower portion of said one side juxtaposed against the lower portion of the other side of the folded sheet and then bent transversely to form the bottom of the U, and then upwardly parallel to the one side upper portion to serve as the opposite wall of the U-shaped channel.

* * * * *